(12) United States Patent
Lee

(10) Patent No.: US 7,517,799 B2
(45) Date of Patent: Apr. 14, 2009

(54) METHOD FOR FORMING A PLURALITY OF METAL LINES IN A SEMICONDUCTOR DEVICE USING DUAL INSULATING LAYER

(75) Inventor: June Woo Lee, Osan-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 258 days.

(21) Appl. No.: 11/320,408

(22) Filed: Dec. 29, 2005

(65) Prior Publication Data

US 2006/0205212 A1    Sep. 14, 2006

(30) Foreign Application Priority Data

Dec. 29, 2004    (KR)    .................. 10-2004-0115538

(51) Int. Cl.
*H01L 21/44* (2006.01)
(52) U.S. Cl. .................. 438/668; 257/E21.577
(58) Field of Classification Search .................. 438/624, 438/668; 257/E21.577

See application file for complete search history.

(56) References Cited

U.S. PATENT DOCUMENTS

| | | | | | |
|---|---|---|---|---|---|
| 4,702,792 | A | * | 10/1987 | Chow et al. .................. | 438/692 |
| 5,242,861 | A | * | 9/1993 | Inaba ......................... | 438/627 |
| 5,905,298 | A | * | 5/1999 | Watatani ...................... | 257/635 |
| 2002/0093078 | A1 | * | 7/2002 | Paek .......................... | 257/676 |
| 2005/0051904 | A1 | * | 3/2005 | Kim et al. .................... | 257/777 |

* cited by examiner

*Primary Examiner*—Asok K Sarkar
(74) *Attorney, Agent, or Firm*—Lowe Hauptman Ham & Berner, LLP

(57) ABSTRACT

A method for forming a plurality of metal lines in a semiconductor device including forming first insulating layer patterns on a semiconductor substrate, the first insulating patterns being spaced from each other; depositing a metal layer on and between the first insulating layer patterns; planarizing the metal layer; patterning the planarized metal layer to form the plurality of metal lines between the first insulating layer patterns; and forming a second insulating layer on and between the metal lines.

12 Claims, 4 Drawing Sheets

METHOD FOR FORMING A PLURALITY OF METAL LINES IN A SEMICONDUCTOR DEVICE USING DUAL INSULATING LAYER

This application claims the benefit of Korean Application No. 10-2004-0115538, filed on Dec. 29, 2004, which is incorporated by reference herein in its entirety.

BACKGROUND OF THE INVENTION

1. Field of the Invention

The present invention generally relates to a metallization method of a semiconductor device, and particularly to a method for forming a plurality of metal lines on a semiconductor substrate using a dual insulating layer.

2. Description of the Related Art

As the integration and miniaturization of semiconductor devices are increased, the dimension of a metal line for interconnecting circuits is decreased more and more. For a higher operational speed of devices, metal interconnecting lines need to be designed to have a low electric resistivity. In general, the electric resistivity is proportional to the width and height of the metal line, and inversely proportional to length thereof. The height of the metal line, as well as the width thereof, should be reduced to a minimum. However, the height and width have a critical value in view of limitations of the metal line formation process. Therefore, an aspect ratio (i.e., a ratio of height-to-diameter) of the gaps between the metal lines, which may be filled with an insulating material, is increased according to the miniaturization of the devices.

Conventionally, low resistivity metals such as aluminum, copper and their alloys have been widely used as fine metal lines in semiconductor manufacturing. As a typical example, aluminum alloyed with copper of about 1~4 wt % is used for the fine metal line, which is resistant to electromigration. The aluminum metal line is generally formed by a physical vapor deposition (PVD) process, also known as a sputtering process, which involves the steps of: depositing a metal thin film on a substrate; etching the metal thin film to form metal lines; and filling gaps between the metal lines with an insulating material.

However, today's emphasis on scaling down line width dimension of the metal lines has led to gap-fill problems due to a high aspect ratio of the gaps. A variety of alternative approaches have been explored for forming fine metal lines in a semiconductor substrate.

One approach is to utilize a damascene method, but it may incur increase of electric resistivity of the metal line owing to the diffusion of chemical impurities. Another approach is to employ an aluminum gap-fill process using chemical vapor deposition (CVD), but this may lead to reliability problems including electromigration.

In order to solve these problems, Korean Patent Publication No. 10-2003-005600 discloses a multilayered metallization structure with a barrier metal layer. The barrier metal layer is formed on an upper surface and sidewall of an insulating layer and a contact plug is formed to interconnect with an underlying metal line in a bottom portion of the insulating layer. This metallization structure can reduce the electric resistivity of metal lines, because the insulating layer is disposed between metal lines. Yet, it is difficult for metal to fill a high aspect ratio of the gaps present in the insulating layer.

SUMMARY OF THE INVENTION

It is, therefore, an object of the present invention to provide a method for forming a plurality of metal lines in a semiconductor device using a dual insulating layer. The metal deposition can be easily performed without gap-fill problems, even by a PVD sputtering process generally known as having inferior step coverage.

To achieve the above objects, an embodiment of a method for forming a plurality of metal lines in a semiconductor device, according to the present invention includes: (a) forming first insulating layer patterns on a semiconductor substrate, the first insulating patterns being spaced to each other; (b) depositing a metal layer on and between the first insulating layer patterns; (c) planarizing the metal layer; (d) patterning the planarized metal layer to form the plurality of metal lines between the first insulating layer patterns; and (e) forming a second insulating layer on and between the metal lines.

It is to be understood that both the foregoing general description of the invention and the following detailed description are exemplary, but are not restrictive of the invention.

BRIEF DESCRIPTION OF DRAWINGS

These and other aspects of the present invention will become evident by reference to the following description of the invention, often referring to the accompanying drawings.

DETAILED DESCRIPTION OF THE INVENTION

The present invention utilizes a couple of insulating layers to reduce an aspect ratio of gaps into which metal lines may be deposited. It should be understood that the techniques and resulting structures are not limited to using any specific substrates and dielectric or insulating overlays. Moreover, the present invention is not restricted to any particular metal or metal alloys. Hereinafter, an exemplary embodiment of the present invention will be described in detail, with reference to FIGS. 1A to 1H.

Figure 1A:
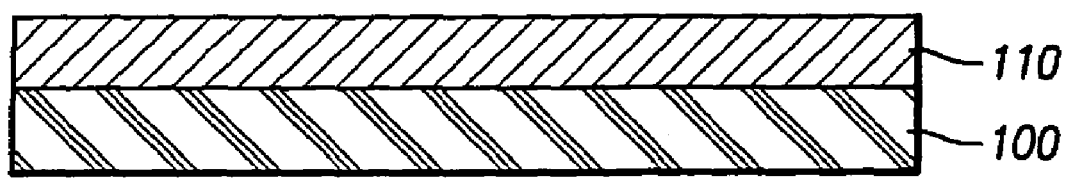
FIGS. 1A to 1H are cross-sectional views of a semiconductor substrate, illustrating an embodiment of a method for forming metal lines in a semiconductor device, according to the present invention.

Referring to FIG. 1A, a first insulating layer 110 is formed on a semiconductor substrate 100. Preferably, a thickness or height of the first insulating layer 110 is from about ⅓ to about ⅔ of that of a resulting metal line (see a metal line 130 in FIG. 1E) that may be formed in the subsequent steps.

Figure 1B:
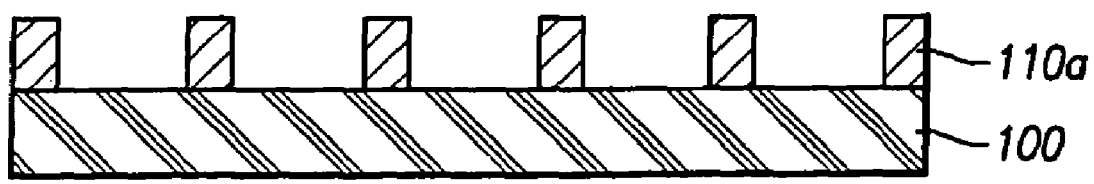

Next, the first insulating layer 110 is patterned to form insulating layer patterns 110a by a photolithography and etch processes, as shown in FIG. 1B.

Figure 1C:
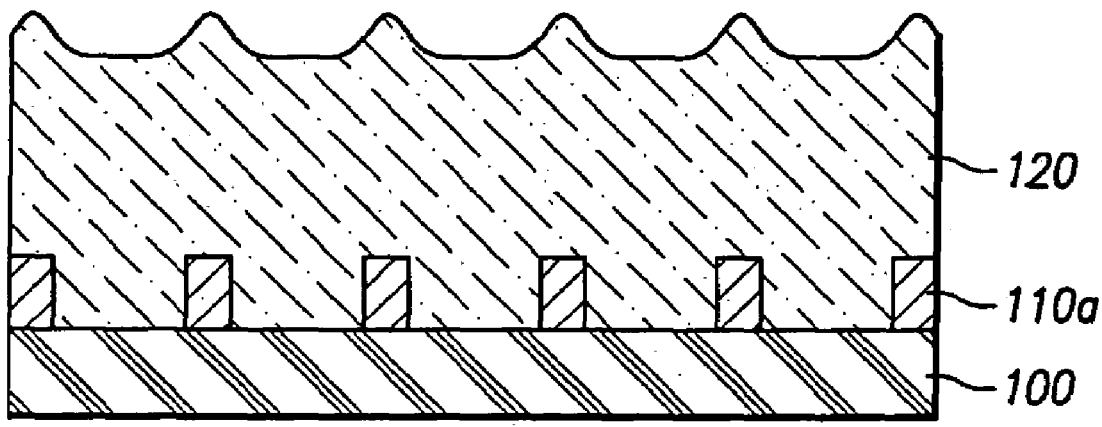

Subsequent to the formation of the insulating layer patterns 110a, metal material 120 such as aluminum is deposited over the entire substrate, filling gaps between the insulating layer patterns 110a, as shown in FIG. 1C. The deposition of the metal material 120, preferably aluminum, is performed by a PVD sputtering process. In this case, the metal material 120 is deposited thicker than the resulting metal line 130, sufficiently covering the insulating layer patterns 110a. Since the insulating layer patterns 110a are formed to be much lower than the resulting metal line 130, the gaps between the insulating layer patterns 110a may have a relatively low aspect ratio. As a result, a PVD-Al layer 120 can fill the gaps without gap-fill issues such as voids.

Figure 1D:
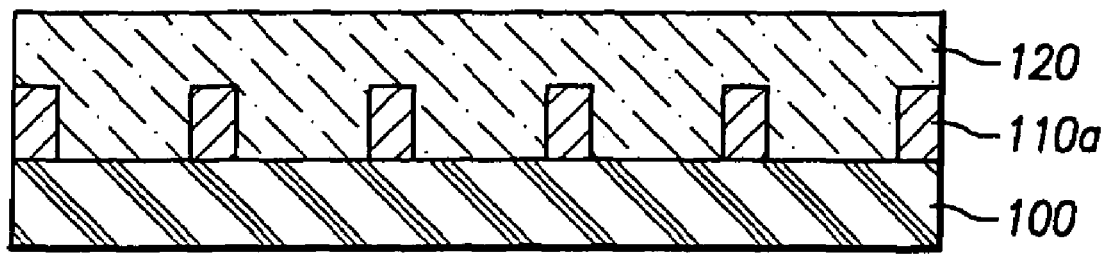

As shown in FIG. 1D, the metal layer 120 is continuously planarized via chemical-mechanical polishing (CMP) or an etch-back process until it has a desired thickness or height.

Figure 1E:
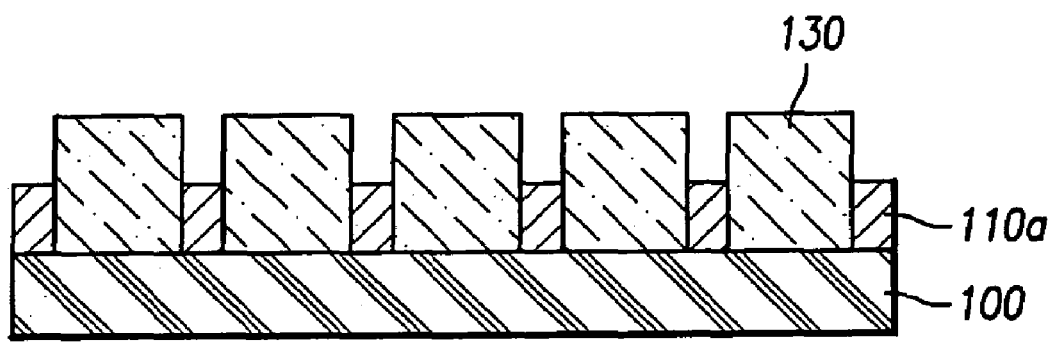

Referring to FIG. 1E, the planarized metal layer 120 is patterned to form metal lines 130 by a photolithography and etching processes using a photo mask. The photo mask defines openings over regions in which the insulating layer patterns 110*a* are formed. Namely, portions of the metal layer 120 over the insulating layer patterns 110*a* may be removed. In this case, the etching process is controlled to expose upper surfaces of each of insulating layer patterns 110*a*.

Figure 1F:
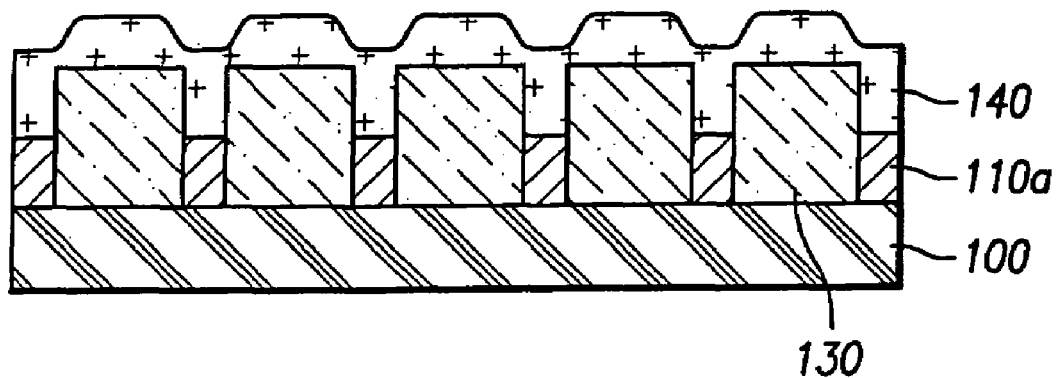

Next, as shown in FIG. 1F, a second insulating layer 140 is formed over the entire substrate 100, thus covering the metal lines 130 and filling gaps between the metal lines 130. The gaps between the metal lines 130, in which the first insulating layer patterns 110*a* remains, may have a relatively low aspect ratio. Preferably, the gap filling with the second insulating material is performed by high-density plasma CVD.

Figure 1G:
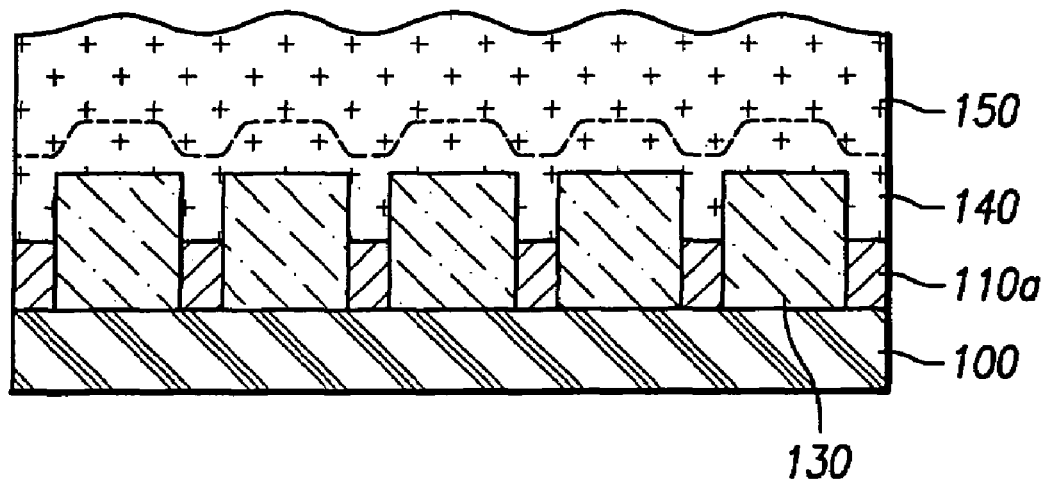
Figure 1H:
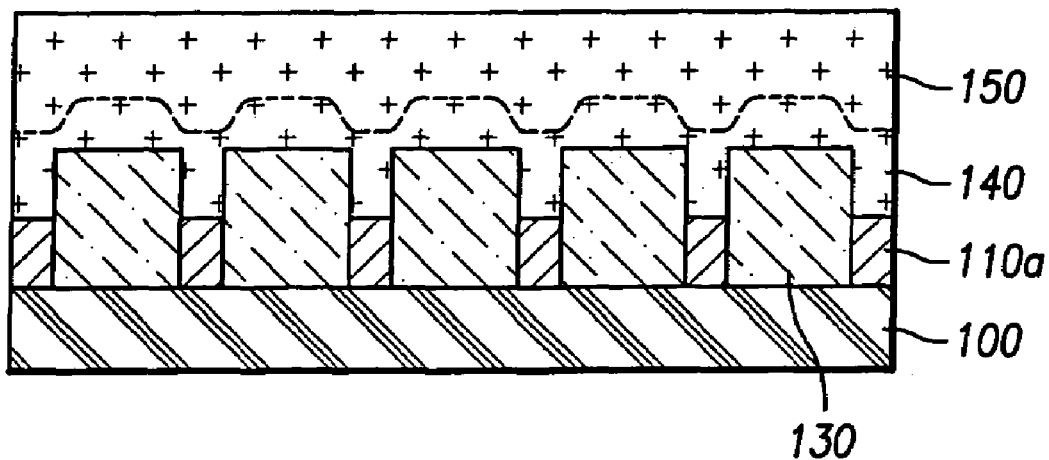

A capping layer 150 may be selectively formed on the second insulating layer 140, as shown in FIG. 1G, and the substrate is then planarized by a CMP process, as shown in FIG 1H.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for forming a plurality of metal lines in a semiconductor device, comprising:
   forming a first insulating layer on a semiconductor substrate;
   patterning the first insulating layer to form a plurality of first insulating layer patterns, said first insulating layer patterns being spaced away from each other;
   depositing a metal layer on and between the first insulating layer patterns;
   planarizing the metal layer;
   patterning the planarized metal layer to form the plurality of metal lines between the adjacent first insulating layer patterns;
   forming a second insulating layer on and between the metal lines.

2. The method of claim 1, wherein the first insulating layer patterns are formed to be lower than the metal lines.

3. The method of claim 2, wherein a height of the first insulating layer patterns is ⅓ to ⅔ of that of the metal lines.

4. The method of claim 1, further comprising planarizing the second insulating layer.

5. The method of claim 1, wherein the metal layer comprises aluminum.

6. The method of claim 1, wherein the metal layer is deposited by a sputtering process.

7. The method of claim 1, wherein the second insulating layer is formed by high-density plasma CVD.

8. The method of claim 1, wherein patterning the planarized metal layer includes patterning by a photolithography and etching processes using a photo mask, said photo mask defines openings over regions in which the first insulating layer patterns are formed.

9. The method of claim 8, wherein subsequent to patterning the metal layer, an upper surface of each of the first insulating layer patterns is exposed.

10. The method of claim 9, wherein
    the second insulating layer covers an upper side portion and an upper surface of each of the metal lines; and
    the second insulating layer covers the upper surface of the first insulating layer patterns.

11. The method of claim 1, wherein the metal layer covers an entirety of each of the first insulating patterns exposed on the substrate.

12. The method of claim 1, wherein a thickness of the deposited metal layer is greater than a height of the metal lines.

\* \* \* \* \*